(12) United States Patent
Ryan

(10) Patent No.: US 11,264,985 B1
(45) Date of Patent: Mar. 1, 2022

(54) BIPOLAR PULSED-VOLTAGE GATE DRIVER

(71) Applicant: AES Global Holdings PTE Ltd., Singapore (SG)

(72) Inventor: Robert Ryan, Denver, CO (US)

(73) Assignee: AES Global Holdings PTE Ltd., Singapore (SG)

( * ) Notice: Subject to any disclaimer, the term of this patent is extended or adjusted under 35 U.S.C. 154(b) by 0 days.

(21) Appl. No.: 17/192,177

(22) Filed: Mar. 4, 2021

(51) Int. Cl.
*H03B 1/00* (2006.01)
*H03K 3/00* (2006.01)
*H03K 17/687* (2006.01)

(52) U.S. Cl.
CPC . *H03K 17/6871* (2013.01); *H03K 2217/0063* (2013.01); *H03K 2217/0072* (2013.01)

(58) Field of Classification Search
CPC ....... H03K 17/6871; H03K 2217/0063; H03K 2217/0072
USPC .......................................................... 327/109
See application file for complete search history.

(56) References Cited

U.S. PATENT DOCUMENTS 9,590,621 B2   3/2017  Young
2003/0164721 A1*  9/2003  Reichard ............. H03K 17/691
                                                              327/108

OTHER PUBLICATIONS

"Transformer-Isolated Gate Driver Provides Very Large Duty Cycle Ratios"; International Rectifier; 6 pages.

* cited by examiner

*Primary Examiner* — Metasebia T Retebo

(57) ABSTRACT

A gate driver circuit comprises a gate-driver assembly, a transformer, first and second circuit voltage outputs, first and second switching devices, and a controller. The gate-driver assembly comprises a first and second voltage inputs and a first and second voltage outputs coupled to a primary winding of the transformer. The first and second switching devices are coupled to the secondary winding and respectively coupled to the first and second circuit voltage outputs. The controller is configured to cause the first circuit voltage output to supply a positive output voltage by supplying a higher first input voltage to the first voltage input than to the second voltage input and is also configured to cause the first circuit voltage output to supply a negative output voltage by supplying a higher second input voltage to the second voltage input than to the first voltage input.

17 Claims, 5 Drawing Sheets

BIPOLAR PULSED-VOLTAGE GATE DRIVER

TECHNICAL FIELD

Aspects of the disclosure are related to power supplies and, in particular, to power supply gate drivers.

BACKGROUND

A power supply typically converts an incoming voltage into a different, output voltage. For example, an alternating current (AC) input voltage may be converted to a direct current (DC) voltage for use by electronic equipment. In another example, a first DC input voltage may be converted to a different DC voltage for use by the electronic equipment.

Power supply topologies can include driving a high-side or floating semiconductor switch. These topologies include, for example, a buck converter, an LLC converter, a half-bridge converter, a full-bridge converter, a totem-pole boost converter, etcetera. Known solutions to driving the high-side semiconductor switch include using a bootstrap gate driver circuit, an isolated gate driver circuit, or different variations of transformer gate driver circuits. Such solutions can have a reduced duty cycle range of the semiconductor switch and can affect implementation costs.

OVERVIEW

In accordance with one aspect, a gate driver circuit comprises a gate-driver assembly, a transformer, first and second circuit voltage outputs, first and second switching devices, and a controller. The gate-driver assembly comprises a first voltage input and a first voltage output configured to provide a first output voltage based on a first input voltage supplied to the first voltage input. The gate-driver assembly also comprises a second voltage input and a second voltage output configured to provide a second output voltage based on a second input voltage supplied to the second voltage input. The transformer comprises a primary winding coupled to the first voltage output and to the second voltage output and comprises a secondary winding. The first switching device is coupled to the secondary winding and coupled to the first circuit voltage output, and the second switching device is coupled to the secondary winding and coupled to the second circuit voltage output. The controller is configured to cause the first circuit voltage output to supply a positive output voltage with respect to an output voltage supplied by the second circuit voltage output by supplying a higher first input voltage to the first voltage input than a second input voltage supplied to the second voltage input. The controller is also configured to cause the first circuit voltage output to supply a negative output voltage with respect to the output voltage supplied by the second circuit voltage output by supplying a higher second input voltage to the second voltage input than the first input voltage supplied to the first voltage input.

In accordance with another aspect, a power supply circuit comprises a high-side switching device and a high-side gate driver having a voltage output. The high-side gate driver comprises a gate-driver assembly comprising a pair of voltage inputs and a pair of voltage outputs, a transformer having a primary winding and a secondary winding, and a pair of switching devices coupled to the secondary winding and to the voltage output. A controller is configured to control the high-side switching device into an on state by causing the gate-driver assembly to supply a current from a first output of the pair of voltage outputs to a second output of the pair of voltage outputs through the primary winding. The controller is also configured to control the high-side switching device into an off state by causing the gate-driver assembly to supply the current from the second output to the first output through the primary winding.

In accordance with another aspect, a method comprises applying a first voltage to a first input of a gate-driver assembly and applying a second voltage to a second input of the gate-driver assembly, the first voltage higher than the second voltage. In response to the application of the first and second voltages, the method comprises causing a positive current to flow through a primary winding of a transformer from a first output of the gate-driver assembly to a second output of the gate-driver assembly. In response to the positive current flowing through the primary winding, the method comprises causing a positive inductive current to flow through a secondary winding of the transformer. In response to the positive inductive current flowing through the secondary winding, the method comprises causing a pair of switches coupled to the secondary winding to provide a positive output voltage to a switching device, the switching device configured to turn on in response to the positive output voltage.

BRIEF DESCRIPTION OF THE DRAWINGS

The drawings illustrate embodiments presently contemplated for carrying out embodiments of the present disclosure.

In the drawings.

Figure 1:
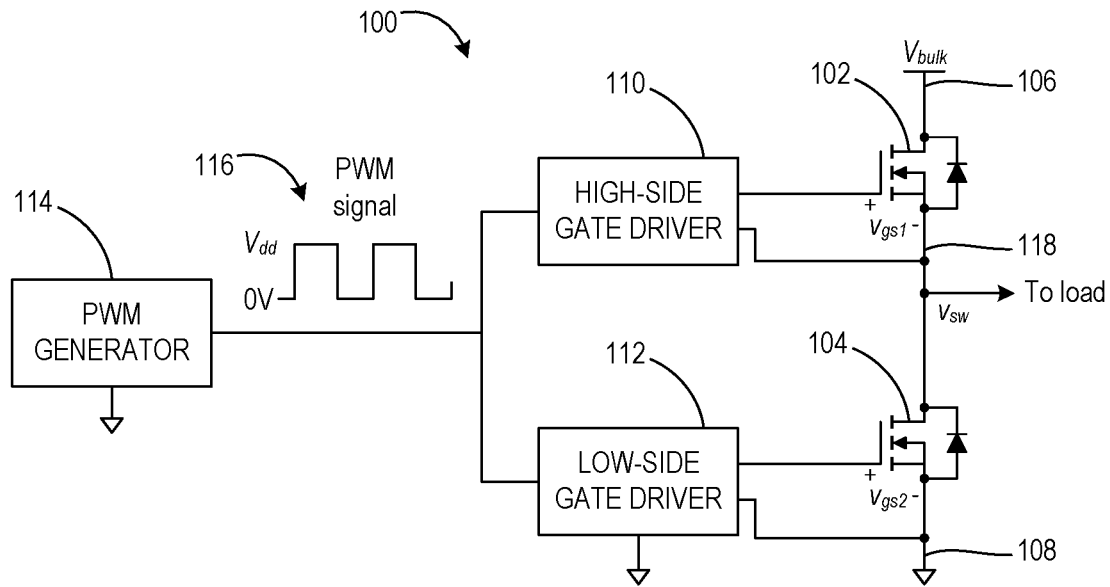
FIG. 1 illustrates a schematic block diagram of a power electronic circuit according to an embodiment of the present disclosure.

While the present disclosure is susceptible to various modifications and alternative forms, specific embodiments thereof have been shown by way of example in the drawings and are herein described in detail. It should be understood, however, that the description herein of specific embodiments is not intended to limit the present disclosure to the particular forms disclosed, but on the contrary, the intention is to cover all modifications, equivalents, and alternatives falling within the spirit and scope of the present disclosure. Note that corresponding reference numerals indicate corresponding parts throughout the several views of the drawings.

DETAILED DESCRIPTION

Examples of the present disclosure will now be described more fully with reference to the accompanying drawings.

The following description is merely exemplary in nature and is not intended to limit the present disclosure, application, or uses.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Although the disclosure hereof is detailed and exact to enable those skilled in the art to practice the invention, the physical embodiments herein disclosed merely exemplify the invention which may be embodied in other specific structures. While the preferred embodiment has been described, the details may be changed without departing from the invention, which is defined by the claims.

FIG. 1 illustrates schematic block diagram of a power electronic circuit building block 100 according to an embodiment of the present disclosure. Driving semiconductor switches on and off is a fundamental aspect of any power electronics circuit. A common building block of power electronic circuits is the half-bridge configuration as shown in FIG. 1. Building block 100 includes two power semiconductor switches: a high-side switch 102 and a low-side switch 104. As illustrated in FIG. 1, the switches 102, 104 are active switches and include transistors (e.g., metal oxide semiconductor field-effect transistors (MOSFETs)). Embodiments of the disclosure, however, contemplate the use of alternative actively controlled switches, passive switches, and the like for either or both switches. The switches 102, 104 are connected in series between a first voltage 106 (e.g., $V_{bulk}$) and a circuit ground 108. The switches 102, 104 are turned on and off by their respective gate driver circuit 110, 112 driven by a pulse width modulation (PWM) generator PWM generator 114 configured to generate one or more PWM signals 116 to drive each gate driver circuit 110, 112. Driving the low-side switch 104 is often a straightforward task using known techniques since the circuitry in the gate drive circuit 112 is referenced to ground 108. The low-side switch 104 can, therefore, be driven by a low-cost low-side gate driver 112. Driving the high-side switch 110 is not as simple as the gate driver circuit because driving this switch involves the gate driver circuit 110 being referenced to a switch-node voltage 118 (e.g., GO.

Known techniques for driving the high-side switch 102 on and off include: 1) level shifting the PWM signal and using a bootstrap circuit to create a floating supply voltage that powers the high-side gate driver, 2) using an isolated gate driver circuit that is powered by an isolated direct current (DC) supply, or 3) using different types of transformer gate drive circuits. These known techniques have different trade-offs when it comes to circuit cost, circuit footprint, circuit power dissipation, wide duty-cycle operation, and current sourcing and sinking capability. In addition, trade-offs exist regarding dv/dt and di/dt noise immunity.

Figure 2:
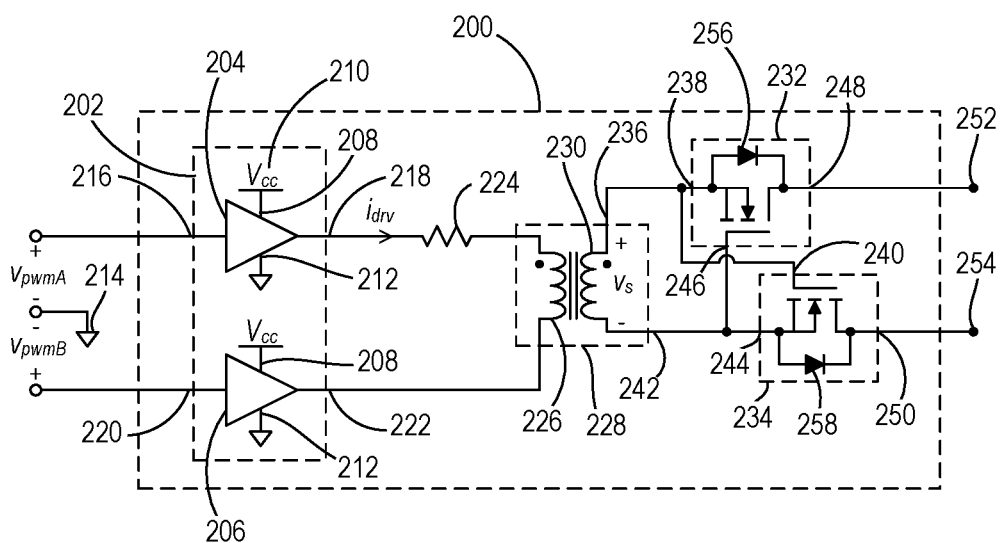
FIG. 2 illustrates a gate driver circuit according to an embodiment.

FIG. 2 illustrates a bipolar pulsed-voltage gate driver circuit 200 for the high-side gate driver circuit 110 of FIG. 1 according to an embodiment that overcomes some of the aforementioned drawbacks. The gate driver circuit 200 includes a dual gate-driver assembly 202 having a pair of buffers 204, 206, each having a voltage input 208 coupled to a source voltage 210 and having a ground input 212 coupled to a signal ground 214.

The dual gate-driver assembly 202 has a first voltage input 216 configured to receive a first input voltage, and a first voltage output 218 is configured to supply a first output voltage signal in response to receiving the first input voltage. For example, a high input voltage signal received on the first voltage input 216 results in a high output voltage signal transmitted by the first voltage output 218. In addition, a second voltage input 220 and a second voltage output 222 are also included for supplying a second output voltage signal on the second voltage output 222 in response to receiving a high input voltage signal on the second voltage input 220.

In the gate driver circuit 200, a resistor 224 and a primary winding 226 of a transformer 228 are coupled in series between the first voltage output 218 and the second voltage output 222. The resistor 224 is configured to limit current flow between the outputs 218, 222 and thus in the primary side of the transformer 228, which in turn limits current flow in the secondary side of the transformer 228. In this manner, resistor 224 limits current flowing out of the gate driver circuit 200 and into a transistor gate (e.g., a gate of high-side switch 102 of FIG. 1). A secondary side of the transformer 228 includes a secondary winding 230 coupled to a first transistor 232 and a second transistor 234. Transistors 232, 234 include n-type transistors (e.g., n-type MOSFETs). As used herein, n-type transistors are those created by doping with an electron donor element during manufacture. As illustrated, a high-side terminal 236 of the secondary winding 230 is coupled to a source terminal 238 of the first transistor 232 and to a gate terminal 240 of the second transistor 234. A low-side terminal 242 of the secondary winding 230 is coupled to a source terminal 244 of the second transistor 234 and to a gate terminal 246 of the first transistor 232. The drain terminals 248, 250 of the transistors 232, 234 are coupled to respective output terminals 252, 254 of the gate driver circuit 200. Body diodes 256, 258 formed between the drain terminals 248, 250 and the 238, 244 of the respective transistor 232, 234 are represented using diode symbols.

Figure 3:
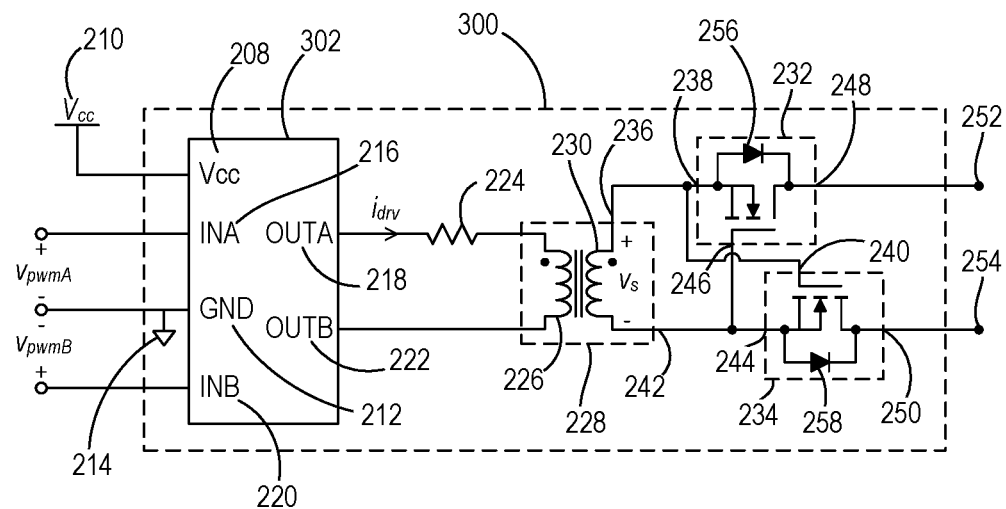
FIG. 3 illustrates a gate driver circuit according to another embodiment.

FIG. 3 illustrates a bipolar pulsed-voltage gate driver circuit 300 according to an embodiment. The gate driver circuit 300 of FIG. 3 is similar to the gate driver circuit 200 of FIG. 2 with the dual gate-driver assembly 202 of FIG. 2 being implemented with a dual gate-driver integrated circuit (IC) 302 such as one commonly available in the marketplace. While placed into the high-side switch driving circuit as described herein, the dual gate-driver IC 302 may be one that is typically used to drive the low-side switch 104. The operation and control of the gate driver circuit 300 is similar or identical to the gate driver circuit 200, and either circuit 200 or 300 may be controlled in the manner described herein.

Figure 5:
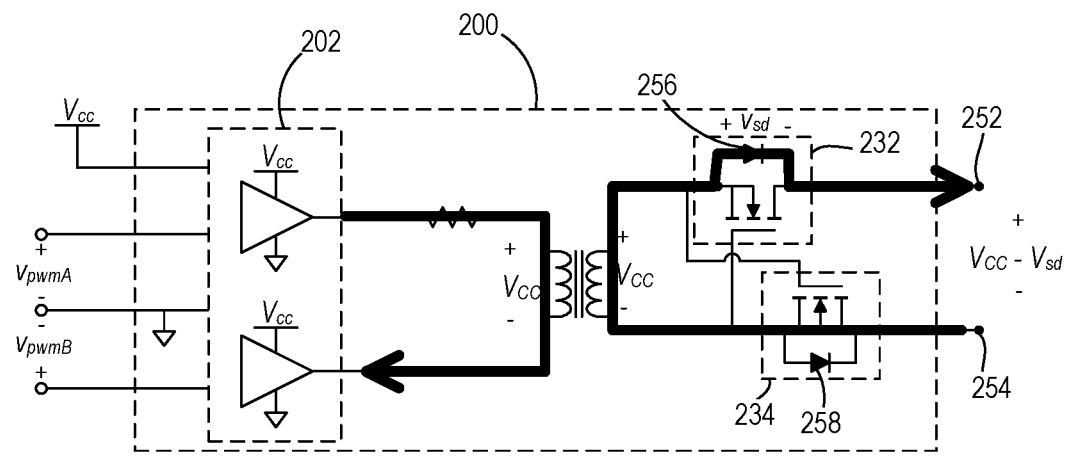
FIG. 5 illustrates current flow in the gate driver circuit of FIG. 2 during a rising-edge delay according to an embodiment.
Figure 4:
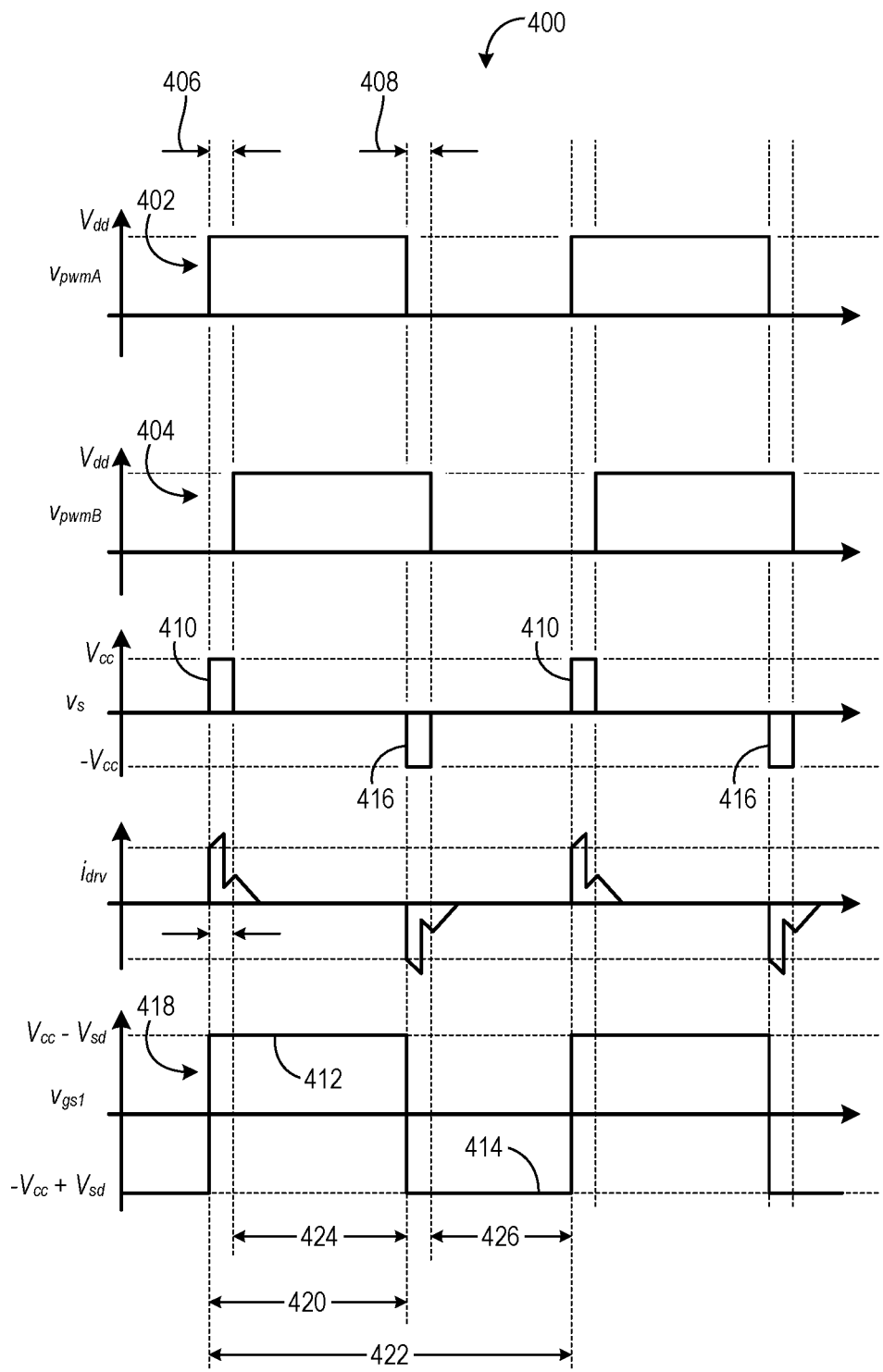
FIG. 4 illustrates waveforms of a control scheme according to an embodiment.

FIG. 4 illustrates waveforms of a control scheme 400 according to an embodiment. Referring to FIGS. 2 and 4, operation of the gate driver circuit 200 as a high-side switch driver includes two separate PWM signals, $v_{pwmA}$ and $v_{pwmB}$, provided by one or more PWM generators or controllers (e.g., a microcontroller) such as PWM generator 114 of FIG. 1. In one embodiment, the PWM signals are digital PWM (DPWM) signals 402, 404 that are separated by a rising-edge delay 406 and a falling-edge delay 408. Separation of the DPWM signals 402, 404 by the rising-edge delay 406 creates a positive pulse 410 across the primary winding 226 of the transformer 228 having a pulse width substantially equal to the width of the rising-edge delay 406. FIG. 5 illustrates current flow during application of the DPWM signal 402 prior to the application of the DPWM signal 404 during the rising-edge delay 406. In response to the DPWM signal 402 (e.g., $v_{pwmA}$) applying a voltage (e.g., $V_{dd}$) to the first voltage input 216, current (illustrated in FIG. 4 as $i_{drv}$) flowing from first voltage output 218 to second voltage output 222 generates a primary voltage (e.g., $V_{cc}$) across the primary winding 226 of the transformer 228. Since the DPWM signal 404 is low during this time, the second voltage output 222 operates as a current sink to allow the current flow through the primary winding 226. A current induced in the secondary winding 230 (e.g., inductive current) generates a secondary voltage (e.g., $V_{cc}$) based on a turns ratio of the primary winding 226 to the secondary winding 230 (e.g., 1:1 as used herein). The positive secondary voltage turns the second transistor 234 on, and the output terminals 252, 254 are charged to a positive voltage 412 (e.g., $V_{cc}$-$V_{sd}$), where $V_{sd}$ is the voltage dropped across the body diode 256 of the first transistor 232. The positive voltage 412 includes the output voltage supplied by the output terminal 252 being higher than the output voltage supplied by the output terminal 254. The output terminals 252, 254 thus supply a positive voltage (e.g., $V_{gs1}$) across the gate and source terminals of the high-side switch 102 of FIG. 1, turning the high-side switch 102 on and allowing it to conduct the voltage $V_{bulk}$ to the load.

At the expiration of the rising-edge delay 406, the DPWM signal 404 (e.g., $v_{pwmB}$) applies a voltage similar to the voltage supplied by the DPWM signal 402 (e.g., $V_{dd}$), which reduces or eliminates the current flow between the first voltage output 218 to second voltage output 222 such that the primary and secondary voltages return to a minimal value such as 0 V. That is, the DPWM signal 404 applies a voltage substantially similar to the voltage supplied by the DPWM signal 402. As used herein, the voltages supplied by DPWM signals 402 and 404 are substantially similar when no current flows from one voltage output 218 to the other voltage output 222 or vice versa or when any current flowing therebetween fails to cause either of the transistors 232, 234 to turn on. With the loss of the secondary voltage value, the second transistor 234 is turned off. Since the first transistor 232 is off and since reverse current flow from the output terminal 252 to the first transistor 232 is prevented by the body diode 256, the voltage across the output terminals 252, 254 and thus the gate charge applied to the high-side switch 102 is halted and held, keeping the high-side switch 102 in a conducting, on state. FIG. 4 illustrates the voltage pulse generated across the secondary winding 230 of the transformer 228 during the rising-edge delay 406 as positive pulse 410.

Figure 6:
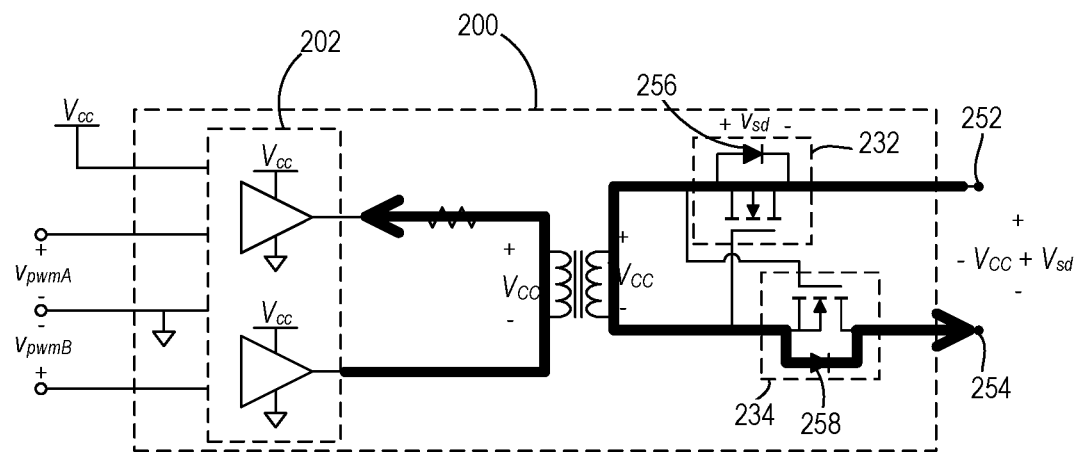
FIG. 6 illustrates current flow in the gate driver circuit of FIG. 2 during a falling-edge delay according to an embodiment.

The high-side switch 102 is turned off during the falling-edge delay 408 in which the current flow through the primary winding 226 of the transformer 228 is reversed as compared with the current flow during the rising-edge delay 406. To reverse the current (as illustrated in FIG. 6), the DPWM signal 402 (e.g., $v_{pwmA}$) drops the voltage applied to the first voltage input 216 at the beginning of the falling-edge delay 408 while the DPWM signal 404 (e.g., $v_{pwmB}$) maintains the voltage previously applied. The loss of the applied voltage to the first voltage input 216 allows the current from the output terminal 254 to be sunk into the output terminal 252, creating a negative voltage (e.g., $-V_{cc}$) across the primary and secondary windings 226, 230 of the transformer 228. The negative voltage turns the first transistor 232 on and charges the output terminals 252, 254 to a negative voltage 414 (e.g., $-V_{cc}+V_{sd}$), which supplies a negative voltage (e.g., $-V_{gs1}$) across the gate and source terminals of the high-side switch 102 of FIG. 1, turning the high-side switch 102 off. The negative voltage 414 includes the output voltage supplied by the output terminal 254 being higher than the output voltage supplied by the output terminal 252. At the expiration of the falling-edge delay 408, the DPWM signal 404 (e.g., $v_{pwmB}$) drops the voltage previously applied, which reduces or eliminates the current flow between the first voltage output 218 to second voltage output 222 such that the primary and secondary voltages return to a minimal value such as 0 V. With the loss of the secondary voltage value, the first transistor 232 is turned off. Since the second transistor 234 is off and since reverse current flow from the output terminal 254 to the second transistor 234 is prevented by the body diode 258, the voltage across the output terminals 252, 254 and thus the gate charge applied to the high-side switch 102 is held, keeping the high-side switch 102 in a non-conducting, off state. FIG. 4 illustrates the voltage pulse generated across the secondary winding 230 of the transformer 228 during the rising-edge delay 406 as a negative pulse 416.

The DPWM signals 402 described herein may be generated and provided by the PWM generator 114 illustrated in FIG. 1. Alternatively, another controller capable of providing the DPWM signals may be used. A variable pulse width may be implemented in order to achieve a duty-cycle control of the gate-source voltage $V_{gs1}$ 418 controlling the switch (e.g., high-side switch 102 of FIG. 1) in the range from 0% to 100%. The duty cycle of the gate-source voltage may be calculated based on the time DT 420 that the gate-source voltage 418 provides the positive voltage 412 to the time T 422 between a rising edge of one positive voltage 412 to the rising edge of the next positive voltage 412. By varying the time T 422, different frequencies of the gate-source voltage can also be achieved.

The variable pulse width for controlling the duty cycle can be implemented using variable edge-delay timing on the $v_{pwmA}$ and $v_{pwmB}$ PWM signals. As illustrated in FIG. 4, a turn-on pulse delay 424 exists between generation of the positive pulse 410 and the corresponding negative pulse 416, and a turn-off pulse delay 426 exists between the negative pulse 416 and the next positive pulse 410. When each delay 424, 426 is greater than zero seconds, the duty cycle may be considered to be variable within a middle range. In the middle range, the length of time during which the positive and negative pulses 410, 416 are on provides a sufficient delay to correspondingly turn the high-side switch 102 on and off. That is, the time length of the positive pulse 410, for example, is at least as long as any circuit delay inherent in receiving the rising edge of the DPWM signal 402 (while the DPWM signal 404 is still low) and generating the resulting positive voltage 412 at the output terminals 252, 254. The time length of the positive pulse 410 can include an additional time buffer to ensure turn-on of the high-side switch 102. The time length of the negative pulse 416 is similarly controlled. The time lengths of the positive and negative pulses 410, 416 may be the same or different.

Holding time T 422 constant, the duty cycle of the gate-source voltage 418 increases or decreases with a respective increase or decrease of the length of the turn-on pulse delay 424 (and corresponding change to the turn-off pulse delay 426). The duty cycle of the gate-source voltage 418 can also increase or decrease holding the turn-on pulse delay 424 constant while respectively decreasing or increasing the turn-off pulse delay 426. Other combinations of varying the turn-on pulse delay 424 and the turn-off pulse delay 426 will result in corresponding changes to the duty cycle and/or the frequency of the gate-source voltage 418. As the length of the turn-on pulse delay 424 decreases, the duty cycle of the gate-source voltage 418 decreases, and the frequency of the gate-source voltage 418 stays the same. As the length of the turn-on pulse delay 424 increases while the length of the time T 422 remains constant, the duty cycle of the gate-source voltage 418 increases, and the frequency of the gate-source voltage 418 stays the same.

Figure 7:
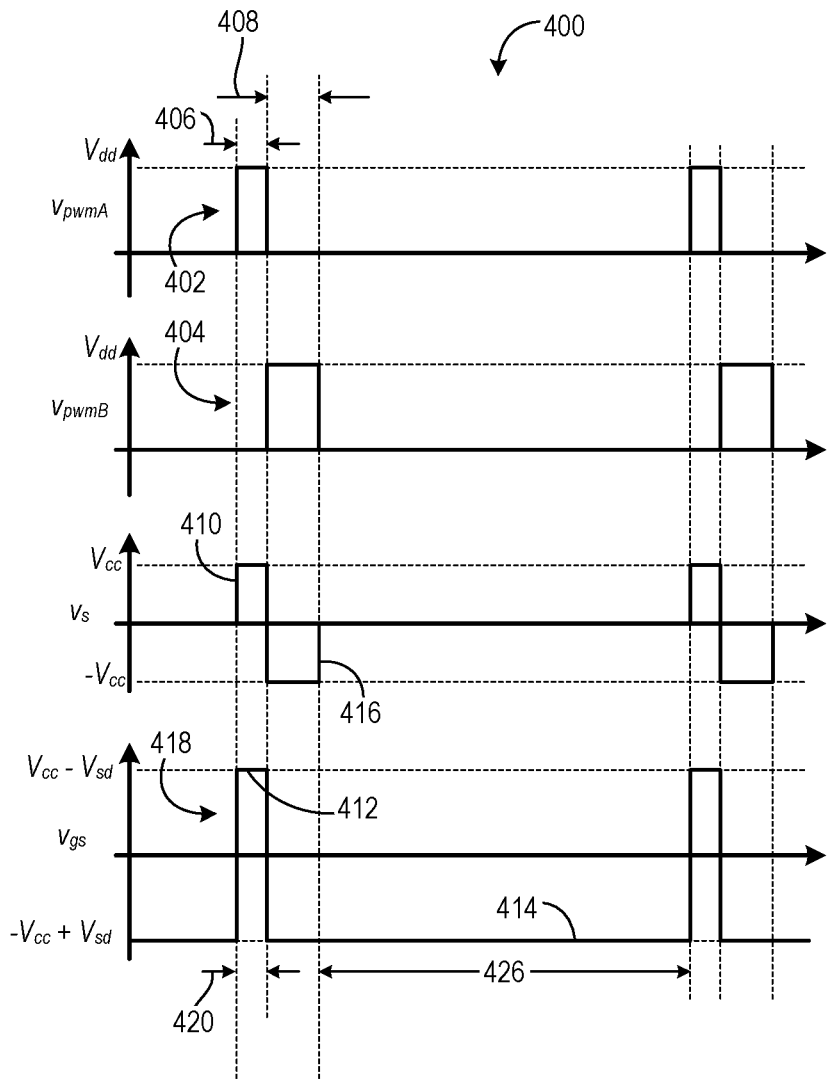
FIG. 7 illustrates waveforms of a control scheme according to another embodiment.

FIG. 7 illustrates waveforms of the control scheme 400 of FIG. 4 according to another embodiment. As illustrated, the positive and negative pulses 410, 416 have been brought together though the elimination of the turn-on pulse delay 424. In this embodiment, the duty cycle may be considered to be variable within a low range. In the low range, the negative pulse 416 is held to a constant pulse width to ensure that the gate of the high-side switch 102 is pulled to the negative voltage 414 every switching cycle. The pulse width of the positive pulse 410, however, may be less than the width of the positive pulse 410 in the middle range (e.g., FIG. 4) and may even be reduced all the way to zero. In this low range, the width of the positive voltage 412 is substantially equal to the width of the positive pulse 410.

Figure 8:
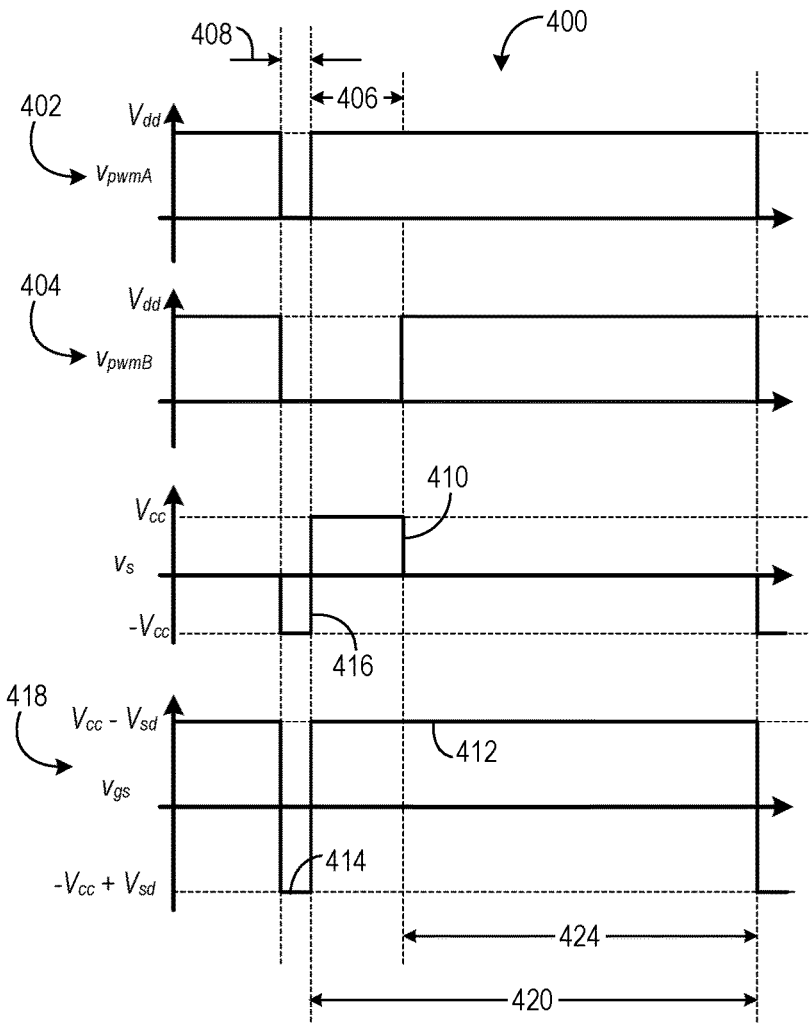
FIG. 8 illustrates waveforms of a control scheme according to another embodiment.

FIG. 8 illustrates waveforms of the control scheme 400 of FIG. 4 according to another embodiment. As illustrated, the positive and negative pulses 410, 416 have been brought together though the elimination of the turn-off pulse delay 426. In this embodiment, the duty cycle may be considered to be variable within a high range. In the high range, the positive pulse 410 is held to a constant pulse width to ensure that the gate of the high-side switch 102 is pulled to the positive voltage 412 every switching cycle. The pulse width of the negative pulse 416, however, may be less than the width of the negative pulse 416 in the middle range (e.g., FIG. 4) and may even be reduced all the way to zero. In this high range, the width of the negative voltage 414 is substantially equal to the width of the negative pulse 416.

Figure 9:
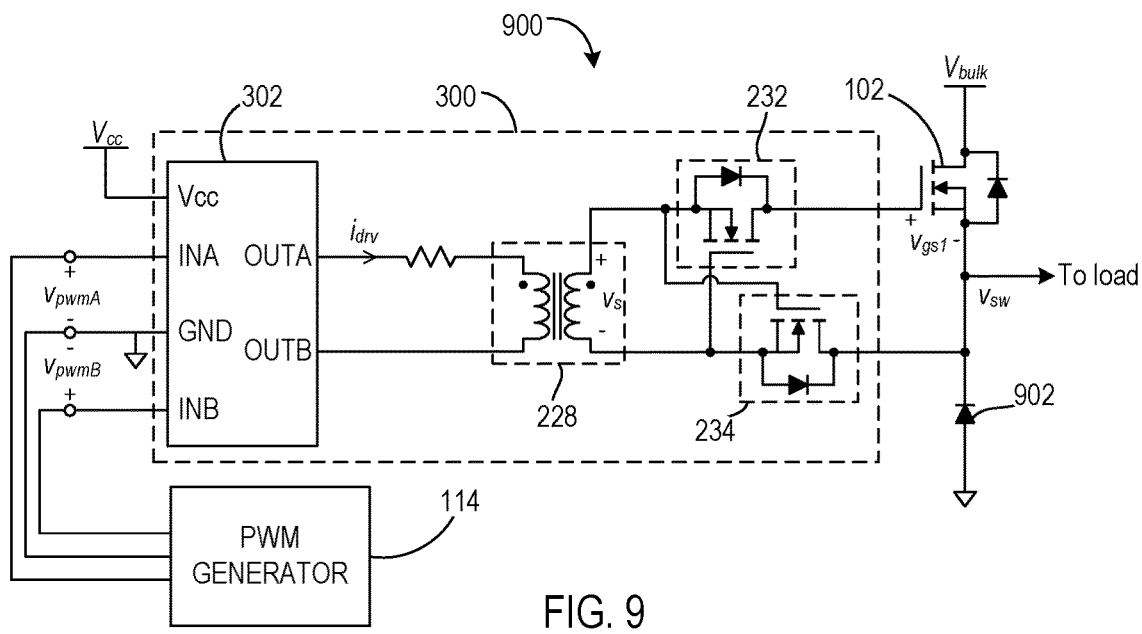
FIG. 9 illustrates a power electronic circuit according to another embodiment.

FIG. 9 illustrates a power electronic circuit 900 according to another embodiment. The power electronic circuit 900 includes the gate driver circuit 300 of FIG. 3 and the high-side switch 102 and PWM generator 114 of FIG. 1. Unlike FIG. 1, FIG. 9 does not include the low-side switch 104 but instead illustrates a switching device 902 implemented as a diode in please of the low-side switch 104. However, operation of the PWM generator 114 and the gate driver circuit 300 to turn the high-side switch 102 on and off may be controlled as described hereinabove.

Embodiments of the disclosure operate to drive a high-side switch using a gate driver circuit that benefits from a galvanically isolated, low printed circuit board footprint. Embodiments described herein comprise a single dual low-side gate driver, a small low-volt-seconds rated transformer, a good ability to source and sink current, and have a generally low part cost. Further, a circuit based on the embodiments described herein allow the high-side switch to operate from a 0% duty cycle to a 100% duty cycle depending on the control of the PWM signals used to drive the gate driver.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the invention is not to be seen as limited by the foregoing description but is only limited by the scope of the appended claims.

What is claimed is:

1. A gate driver circuit comprising:
   a gate-driver assembly comprising:
      a first voltage input;
      a first voltage output configured to provide a first output voltage based on a first input voltage supplied to the first voltage input;
      a second voltage input; and
      a second voltage output configured to provide a second output voltage based on a second input voltage supplied to the second voltage input;
   a transformer comprising:
      a primary winding coupled to the first voltage output and to the second voltage output; and
      a secondary winding;
   a first circuit voltage output;
   a second circuit voltage output;
   a first switching device coupled to the secondary winding and coupled to the first circuit voltage output;
   a second switching device coupled to the secondary winding and coupled to the second circuit voltage output; and
   a controller configured to:
      cause the first circuit voltage output to supply a positive output voltage with respect to an output voltage supplied by the second circuit voltage output by supplying a higher first input voltage to the first voltage input than the second input voltage supplied to the second voltage input; and
      cause the first circuit voltage output to supply a negative output voltage with respect to the output voltage supplied by the second circuit voltage output by supplying a higher second input voltage to the second voltage input than the first input voltage supplied to the first voltage input;
   wherein the first switching device comprises a metal oxide semiconductor field-effect transistor (MOSFET) comprising a gate, a source, and a drain;
   wherein the second switching device comprises a MOSFET comprising a gate, a source, and a drain;
   wherein the drain of the first switching device is coupled to the first voltage output;
   wherein the drain of the second switching device is coupled to the second voltage output; and
   wherein the secondary winding comprises:
      a high-side terminal coupled to the gate of the second switching device and to the source of the first switching device; and
      a low-side terminal coupled to the gate of the first switching device and to the source of the second switching device.

2. The gate driver circuit of claim 1, wherein the gate-driver assembly comprises a dual gate-driver integrated circuit (IC).

3. The gate driver circuit of claim 1, wherein the first switching device comprises a metal oxide semiconductor field-effect transistor (MOSFET) comprising a gate, a source, and a drain; and
   wherein the second switching device comprises a MOSFET comprising a gate, a source, and a drain.

4. The gate driver circuit of claim 1, wherein supplying the higher first input voltage causes the second switching device to turn on.

5. The gate driver circuit of claim 4, wherein the controller is further configured to cause the second switching device to turn off by supplying the second input voltage at a voltage substantially matching the first input voltage while a portion of the first input voltage is being supplied to the first voltage input.

6. The gate driver circuit of claim 5, wherein supplying the higher second input voltage causes the first switching device to turn on.

7. The gate driver circuit of claim 6, wherein the controller is further configured to cause the first switching device to turn off by supplying the first input voltage at a voltage substantially matching the second input voltage while a portion of the second input voltage is being supplied to the second voltage input.

8. The gate driver circuit of claim 1, wherein the controller is further configured to vary a time interval between the positive output voltage and the negative output voltage to control a pulse-width modulation (PWM) output of a load switching device coupled to the first circuit voltage output and to the second circuit voltage output.

9. A method comprising:
applying a first voltage to a first input of a gate-driver assembly;
applying a second voltage to a second input of the gate-driver assembly, the first voltage higher than the second voltage;
in response to the application of the first and second voltages, causing a positive current to flow through a primary winding of a transformer from a first output of the gate-driver assembly to a second output of the gate-driver assembly;
in response to the positive current flowing through the primary winding, causing a positive inductive current to flow through a secondary winding of the transformer;
in response to the positive inductive current flowing through the secondary winding, causing a pair of switches coupled to the secondary winding to provide a positive output voltage to a switching device, the switching device configured to turn on in response to the positive output voltage;
applying the first voltage to the second input after a first delay to reduce the positive current flow through the primary winding while applying the first voltage to the first input; and
in response to reducing the current flow through the primary winding, cause the pair of switches to halt providing the positive output voltage to the switching device.

10. The method of claim 9 further comprising:
applying the second voltage to the first input of the gate-driver assembly;
applying the first voltage to the second input of the gate-driver assembly;
in response to the application of the first and second voltages, cause a negative current to flow through a primary winding of a transformer from the second output of the gate-driver assembly to the first output of the gate-driver assembly;
in response to the negative current flowing through the primary winding from the second output to the first output, cause a negative inductive current to flow through a secondary winding of the transformer; and
in response to the negative inductive current flowing through the secondary winding, cause the pair of switches to provide a negative output voltage to the switching device, the switching device configured to turn off in response to the negative output voltage.

11. The method of claim 10 further comprising:
applying the second voltage to the second input after a second delay to reduce the negative current flow through the primary winding while applying the first voltage to the second input; and
in response to reducing the negative current flow through the primary winding, cause the pair of switches to halt providing the negative output voltage to the switching device.

12. The method of claim 11 further comprising controlling a duty cycle of the switching device by varying a third delay between application of the first voltage to the second input after the first delay and application of the second voltage to the first input.

13. A power supply circuit comprising:
a high-side switching device;
a high-side gate driver having a voltage output and comprising:
a gate-driver assembly comprising a pair of voltage inputs and a pair of voltage outputs;
a transformer having a primary winding and a secondary winding;
a pair of switching devices coupled to the secondary winding and to the voltage output; and
a controller configured to:
control the high-side switching device into an on state by causing the gate-driver assembly to supply a current from a first output of the pair of voltage outputs to a second output of the pair of voltage outputs through the primary winding; and
control the high-side switching device into an off state by causing the gate-driver assembly to supply the current from the second output to the first output through the primary winding;
wherein the pair of switching devices comprises:
a first switching device having a gate, a source, and a drain; and
a second switching device having a gate, a source, and a drain;
wherein the drains of the first and second switching devices are coupled to the voltage output;
wherein the gate of the second switching device and the source of the first switching device are coupled to a high-side terminal of the secondary winding; and
wherein the gate of the first switching device and the source of the second switching device are coupled to a low-side terminal of the secondary winding.

14. The power supply circuit of claim 13, wherein the controller, in being configured to control the high-side switching device into the on state, is configured to:
apply a first voltage to one of the pair of voltage inputs; and
apply a second voltage to the other of the pair of voltage inputs;
wherein the first voltage is higher than the second voltage.

15. The power supply circuit of claim 14, wherein the controller is configured to cause the gate-driver assembly to halt the current through the primary winding by applying the first voltage to the other of the pair of voltage inputs simultaneously with the application of the first voltage to the one of the pair of voltage inputs.

16. The power supply circuit of claim 14, wherein the controller, in being configured to control the high-side switching device into the off state, is configured to:

apply the first voltage to the other of the pair of voltage inputs; and apply the second voltage to the one of the pair of voltage inputs.

17. The method of claim 9, wherein applying the first voltage to the second input after a first delay to reduce the positive current flow comprises applying the first voltage to the second input after the first delay to eliminate the positive current flow.

* * * * *